United States Patent
Ido et al.

(10) Patent No.: US 6,836,492 B2
(45) Date of Patent: Dec. 28, 2004

(54) LASER-DIODE MODULE, OPTICAL TRANSCEIVER AND FIBER TRANSMISSION SYSTEM

(75) Inventors: Tatemi Ido, Kodaira (JP); Kenji Kogo, Hachioji (JP); Kouji Yoshida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/352,064

(22) Filed: Jan. 28, 2003

(65) Prior Publication Data

US 2003/0156608 A1 Aug. 21, 2003

(30) Foreign Application Priority Data

Feb. 15, 2002 (JP) ........................................ 2002-038081

(51) Int. Cl.[7] .............................. H01S 3/04; H01S 5/00
(52) U.S. Cl. ........................................... 372/36; 372/43
(58) Field of Search ......................... 372/34, 36, 43–50

(56) References Cited

U.S. PATENT DOCUMENTS 5,701,060 A * 12/1997 Buhler et al. ........... 315/227 R

FOREIGN PATENT DOCUMENTS

JP 07046194 A * 2/1995 ........... H01S/3/096

* cited by examiner

Primary Examiner—Quyen Leung
(74) Attorney, Agent, or Firm—Antonelli, Terry, Stout & Kraus, LLP

(57) ABSTRACT

An LD module capable of generating a good optical waveform at a high speed of about 10 Gbit/s or higher in which a damping resistor is disposed in parallel with a laser-diode device in the inside of a laser-diode module, the damping resistor being preferably disposed between the connection point of the high-frequency transmission line and the terminating resistor, and the ground.

20 Claims, 16 Drawing Sheets

WITHOUT DAMPING RESISTOR (PRIOR ART)

WITH DAMPING RESISTOR

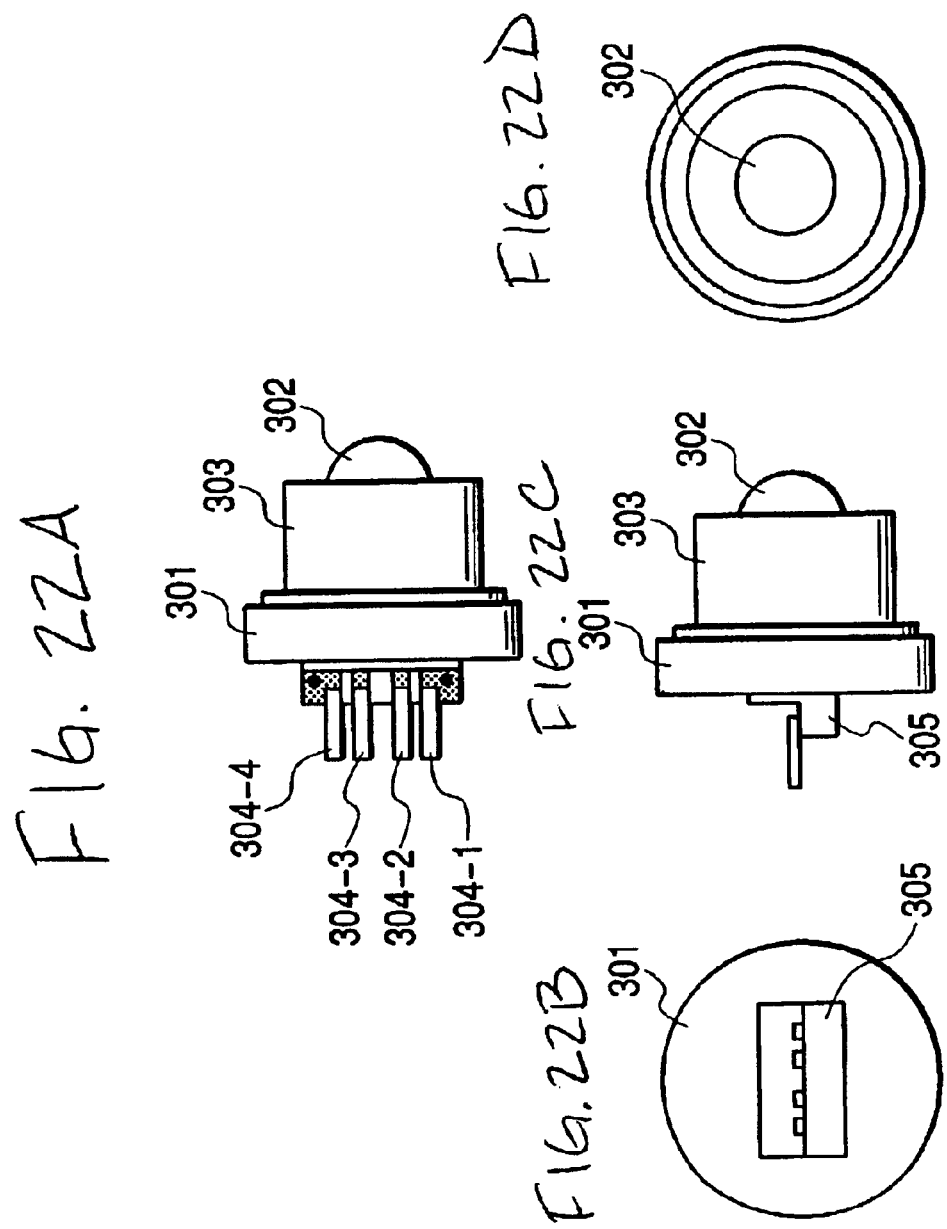

LASER-DIODE MODULE, OPTICAL TRANSCEIVER AND FIBER TRANSMISSION SYSTEM

BACKGROUND OF THE INVENTION

1. Field of the Invention

The present invention relates to a semiconductor laser-diode module for use in optical transmission. It is particularly useful for a semiconductor laser-diode module intended for super high-speed operation at 10 Gbit/s or higher.

2. Related Art

In recent years, speed of optical transmission has been increased rapidly and an optical transmission system at 10 Gbit/s has already been put to practical use. In existent 10 Gbit/s systems, an electro-absorption (EA) type modulator with an integrated laser-diode (hereinafter simply referred to as LD) for generating signals at 10 Gbit/shave been used. The EA modulator with an integrated LD generates optical signals by turning continuous wave light generated from the LD to ON and OFF. The module for the EA modulator with integrated LD is disclosed, for example, in Japanese Patent Laid-open No. 9-252164. In this module, since the range of operation temperature of the EA modulator is narrow, it is necessary that a Peltier device (a the
o-electric cooler) be incorporated to regulate the LD device at a constant temperature. This results in a problem that the module is expensive and the power consumption is large.

While on the other hand, the high speed modulation characteristics and high temperature characteristic of LOs have been improved remarkably recently, and optical signals at 10 Gbit/s can be generated directly by ON and OFF of current supplied to LDs. The direct LO modulation method provides a wide operation temperature range and does not require temperature control by the Peltier device. Accordingly, the module can be reduced in size and cost and the power consumption can be decreased outstandingly. To put the direct modulation method to practical use requires an LD module having a mechanism capable of transmitting driving signals at 10 Gbit/s to an LO device at reduced loss and reflection. LD modules performing high-speed modulation at the level of 2.5 Gbit/s have already been put to practical use. FIG. 19 shows an example of an equivalent circuit model in a state where an existent LD module 1 or package and a driver IC 8 for driving the LD module are connectedly mounted on a printed circuited board. The LD module has a pin 2 for inputting driving signals. Since the pin has stray inductance, it is represented by a symbol showing inductance. Further, the LD module has therein a high-frequency transmission line 3 under impedance matching and a terminating resistor 4 connected to the end of the line. The terminating resistor 4 and the LO device 6 are connected by a wire bond 5. That is, the terminating resistor 4 is connected in series with the LD device 6. Driving signals (electric signals) generated from a driver IC 8 are supplied through the high-frequency transmission line 9 under impedance matching disposed on the printed circuit board, the pin 2 of the LD module, the high-frequency transmission line 3 in the package 1, the terminating resistor 4, and the wire bond 5 to the LD device 6. Reflection of the driving signals is decreased by setting the value of the terminating resistance such that the sum of the resistance value of the terminating resistor 4 and the resistance value (usually of about 5 Ω) of the LD 6 matched with the impedance of high-frequency transmission lines 3 and 9. In this case, the impedance of the high-frequency transmission line is usually set to 20 to 30 Ω) in view of the consumption power of the driving IC and easy constitution. However, since the pin 2 and the wire bond 5 have a stray inductance component (about 2 to 3 nH as the sum of them), electric signals are reflected at the pin 2 and the wire bond 5 of the module and returned to the driver IC 8 also for the electric signals at about 2.5 Gbps/s. The state of signal reflection is shown by arrows in FIG. 19.

The signals returned to the driver IC are reflected at the driver, enter the LD module and transmit to the LD device again. This generates ringing (ghost) in the optical signal waveform of the LD module to deteriorate the optical waveform.

Means for solving this problem is described, for example, in Japanese Patent Laid-open No. 5-327617. This example is shown in FIG. 20. This is a method of inserting a damping resistor 10 between the terminal end of the high-frequency transmission line 9 on the printed circuit board and the ground, that is, a method of inserting the damping resistance 10 so as to be in parallel with the LD module. In FIG. 20, since reference numerals identical to those in FIG. 19 indicate identical members, detailed explanations thereof will be omitted. When the parallel damping resistance 10 is inserted, it is necessary to increase the IC driving current by so much as the current flowing to the damping resistor 10. However, since the electric signals reflected at the input pin 2 or the wire bond 5 are released by way of the resistor 10 to the ground, deterioration of the waveform caused by reflection can be decreased.

However, when the speed of the driving signals increases in the existent LD module as far as about 10 Gbit/s, since reflection by the stray inductance component of the pin or the wire bond increases more and more, there is a problem that the degradation of the wave is further increased. In view of the above, even when the parallel damping resistances disposed on the printed circuit board, for example, in the same manner as in FIG. 20, there is still a problem that the degradation of the waveform due to the reflection of the driving signal cannot be decreased for the signal at 10 Gbit/s.

SUMMARY OF THE INVENTION

An object of the present invention is to provide a laser-diode module with less ringing due to reflection of electric signals even when modulation at super high-speed of generally 10 Gbit/s or more and capable of generating good optical waveforms.

The laser-diode module can be provided by the following means.

A pin for inputting a driving signal is disposed at a package of a laser-diode module (i.e., a terminal for inputting an electric signal), and a laser-diode device, a high-frequency transmission line and a terminating resistor (i.e., a first resistor) thereof and a parallel damping resistor (i.e., a second resistor) are disposed in the inside of the package. One end of the high-frequency transmission line is connected with the pin for inputting a driving signal. The high-frequency transmission line and the terminating resistor thereof are connected in series with the laser-diode device. On the other hand, the parallel damping resistor is connected in parallel with the laser-diode device. In the invention, it is particularly important to place the laser-diode device, the high-frequency transmission line, the terminating resistor thereof (i.e., the first resistor) and a parallel damping resistor (that is second resistor) in the package. In a specific example, a first electrode of the laser-diode device is connected by way of the terminating resistor to the other end of the high-frequency transmission line and the parallel damping resistor is disposed between the connection point of the high-frequency transmission line and the terminating resistor, and the second electrode of the laser-diode. To obtain a good optical waveform, it is desirable to set the distance between the parallel damping resistor and the laser-diode to 2.4 mm or less. To reduce the consumption power by a bias current, the module may be constituted such that a second pin for applying a DC bias current is disposed at the module and is connected to the first electrode of the laser-diode device by way of a device for blocking the high frequency signal (for example, inductor or ferrite bead). In a case where the impedance of the high-frequency transmission lines is from 20 to 30 Ω, the resistance value of the parallel damping resistor device is set preferably to 67 to 300 Ω.

DESCRIPTION OF THE ACCOMPANYING DRAWINGS

Figure 10A:
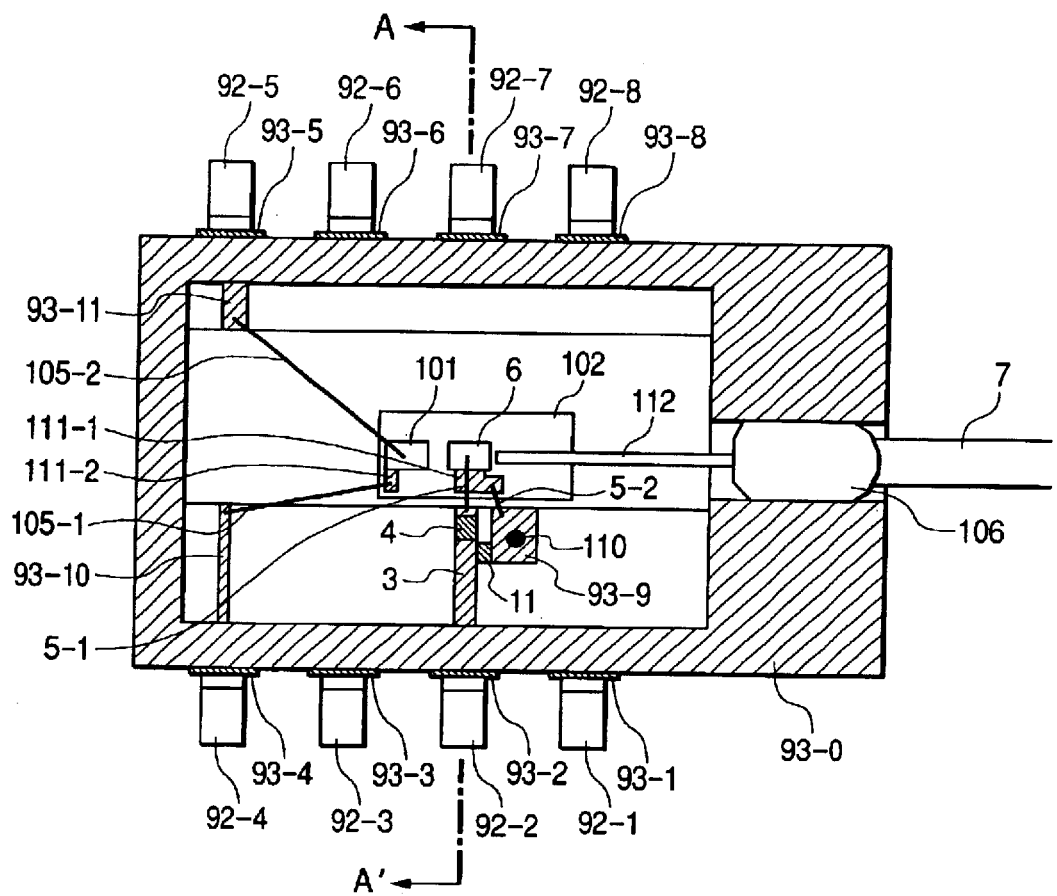
Figure 10B:
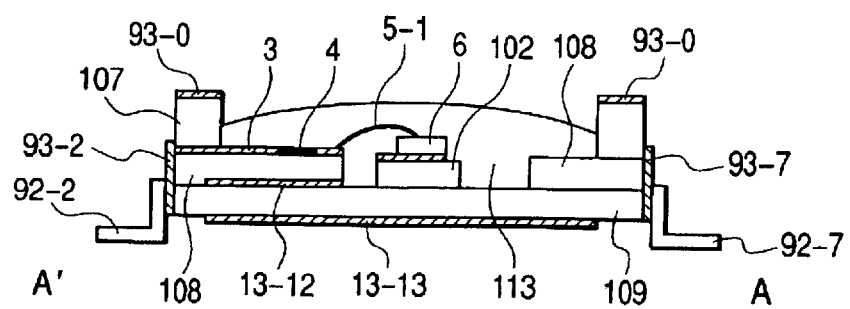
Figure 13A:
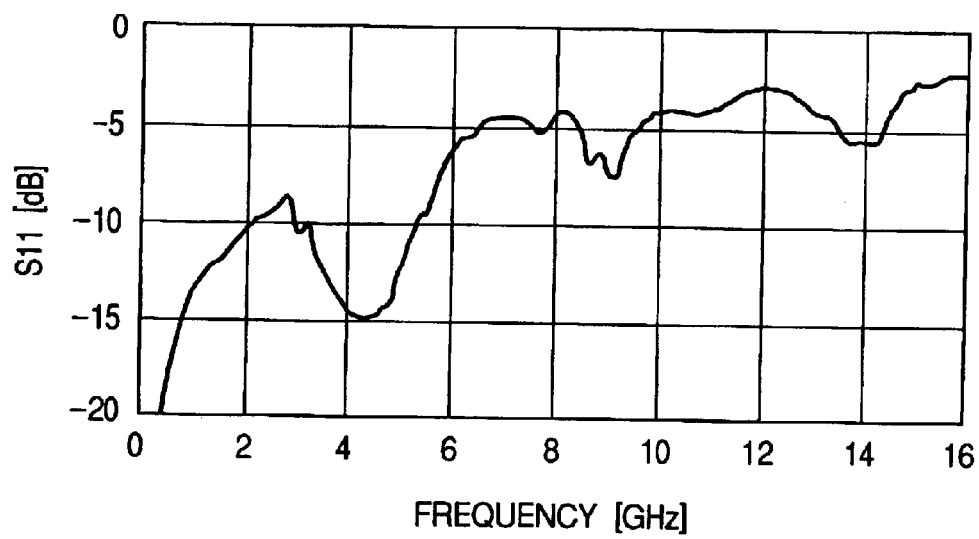
Figure 13B:
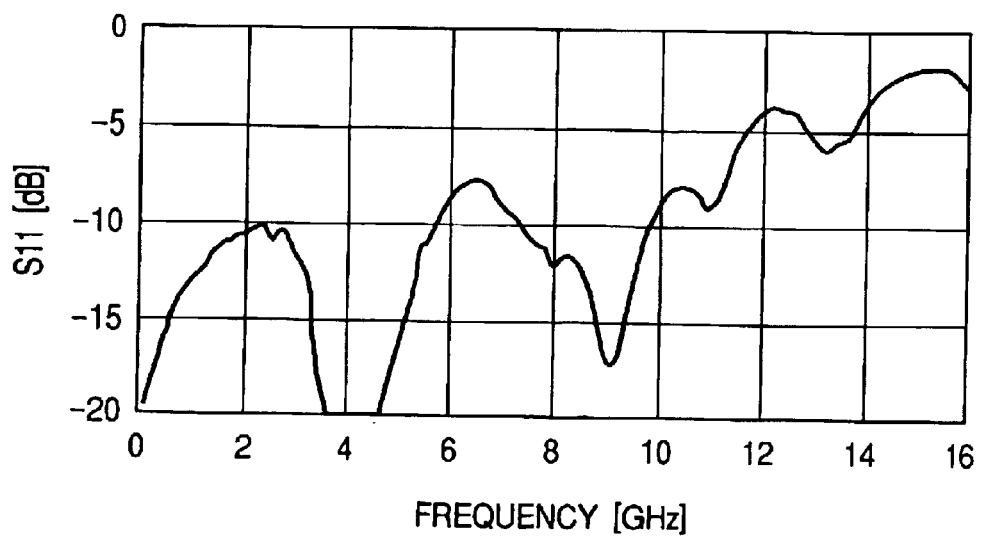
Figure 14:
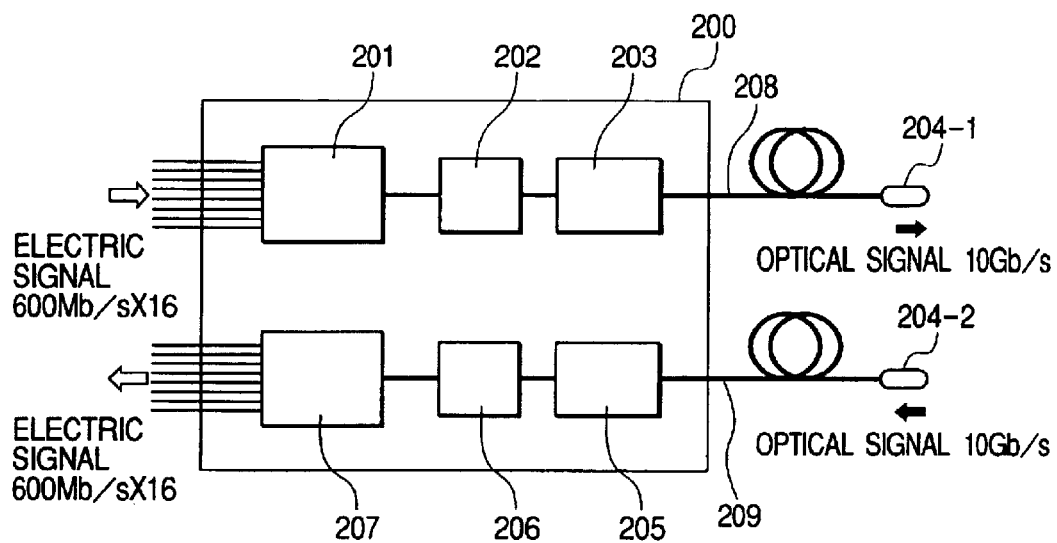
Figure 15:
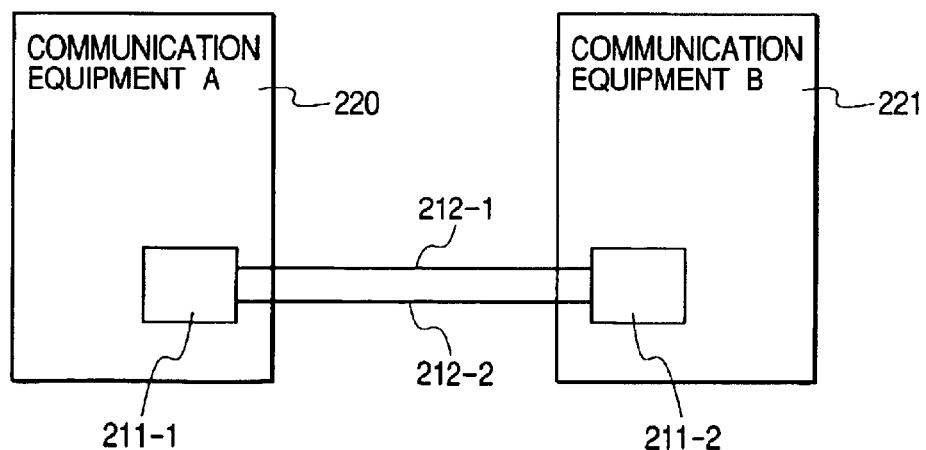
Figure 16A:
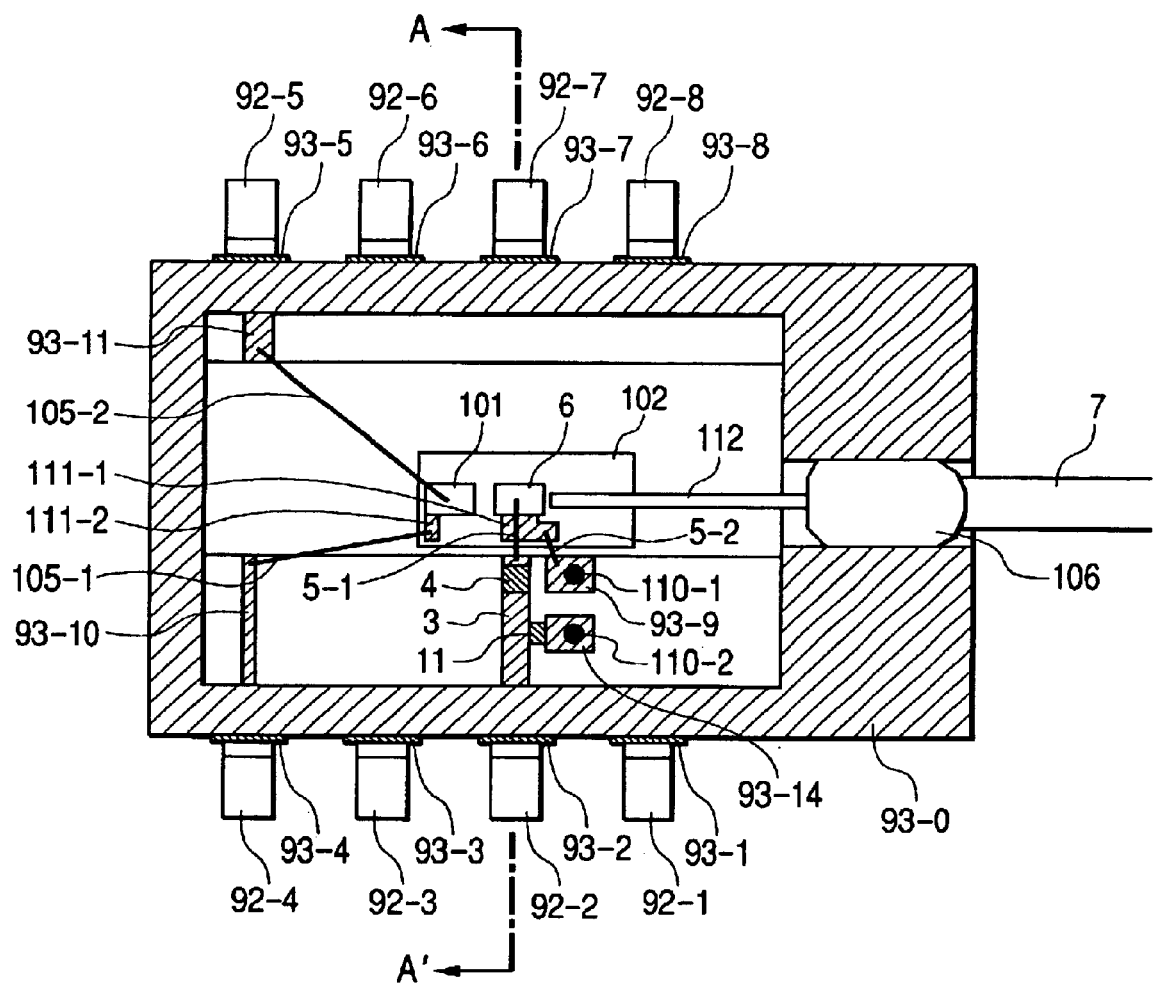
Figure 16B:
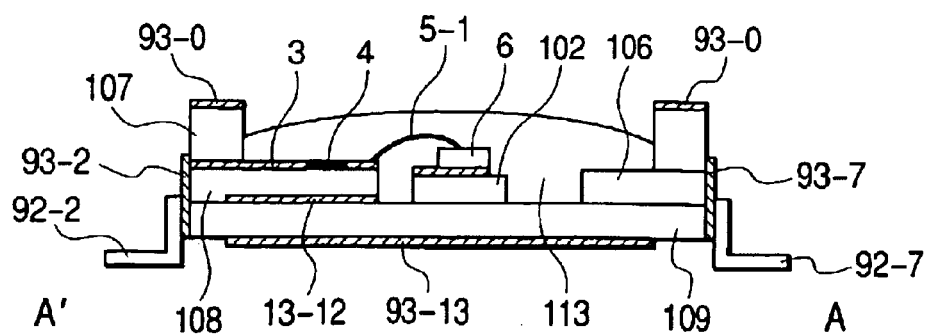
Figure 17A:
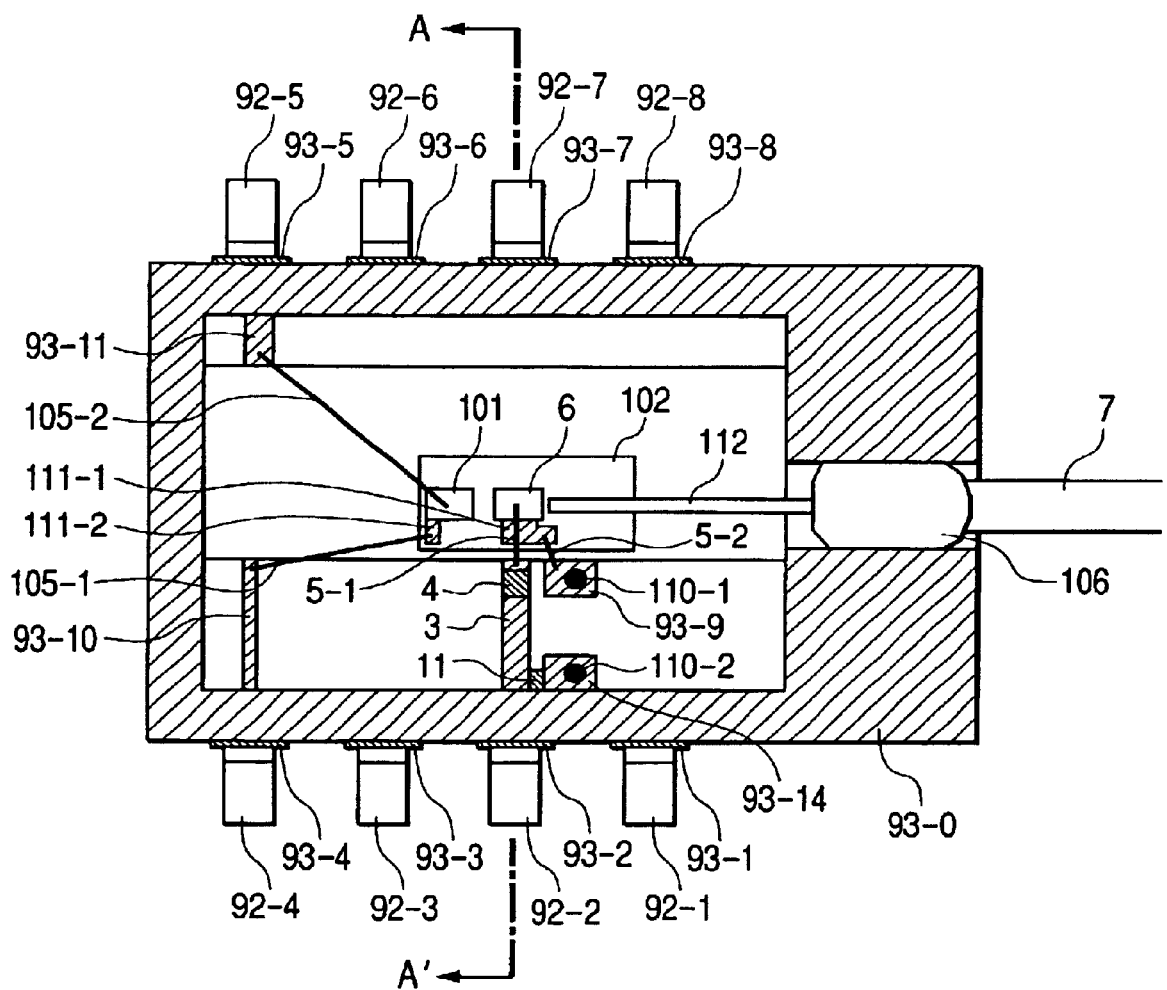
Figure 17B:
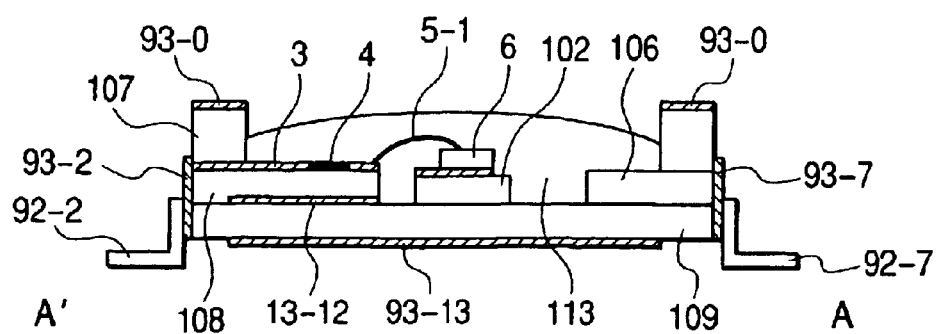
Figure 18A:
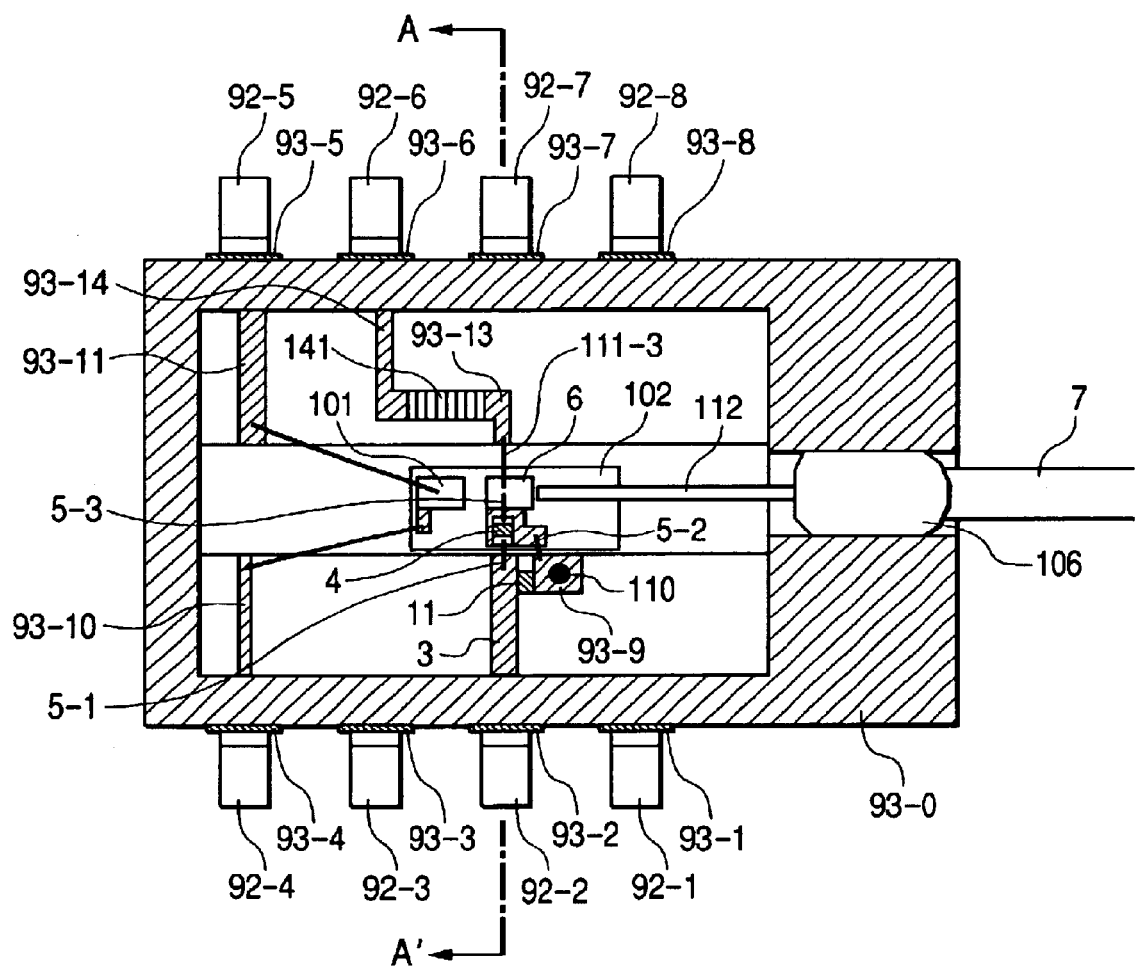
Figure 18B:
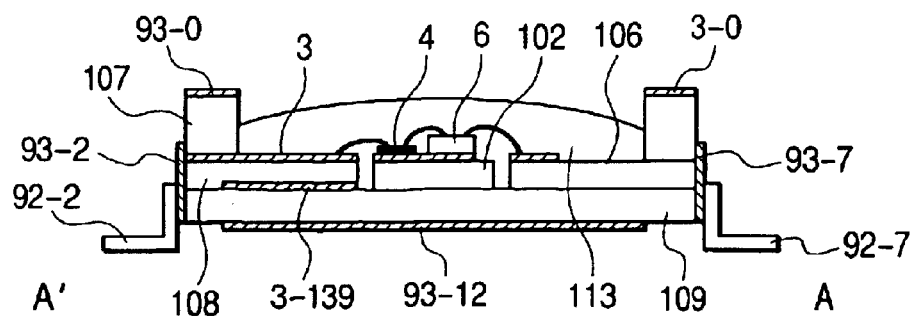
Figure 19:
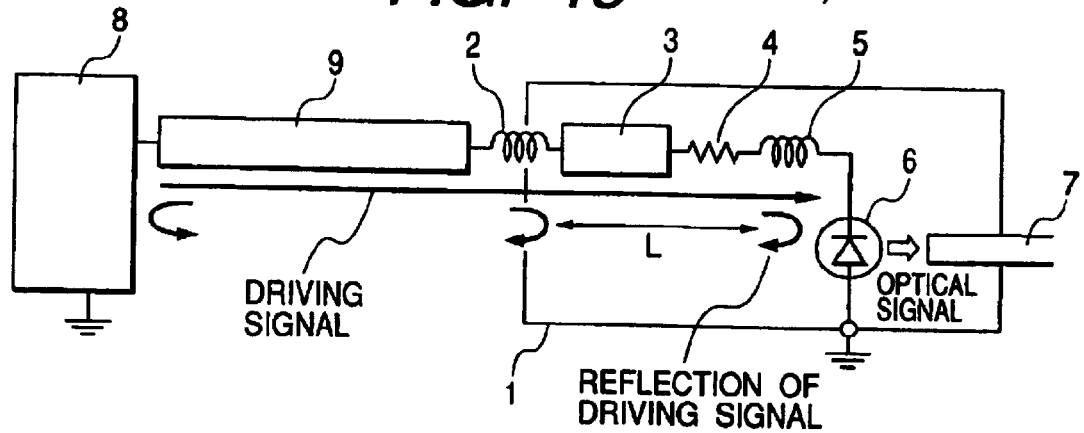
Figure 20:
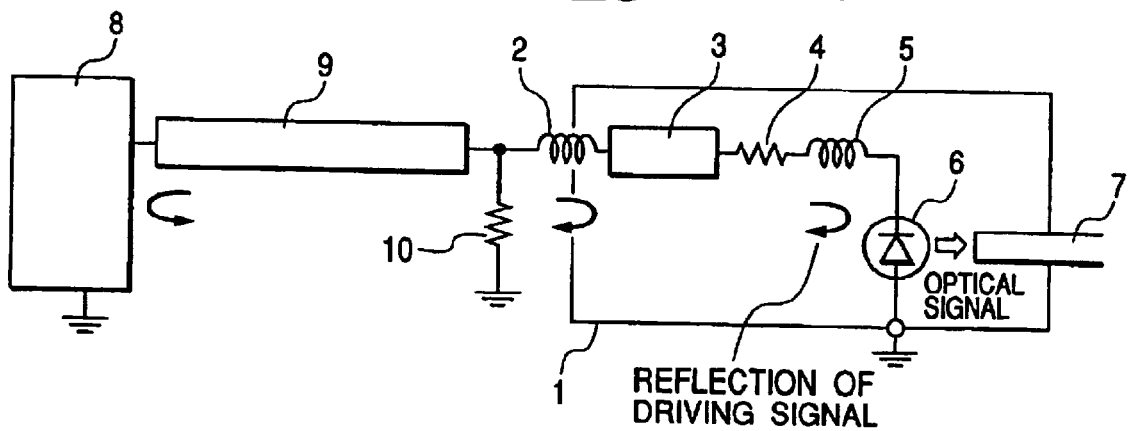
Figure 21:
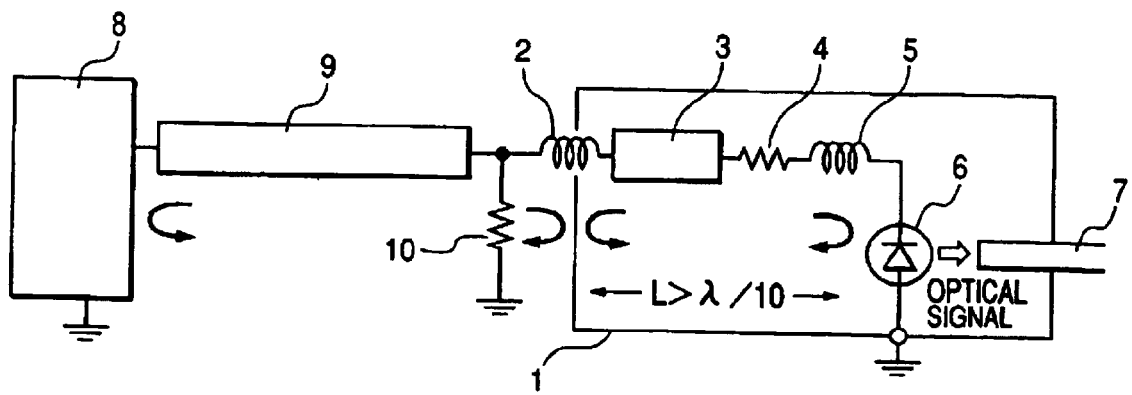
Figure 23A:
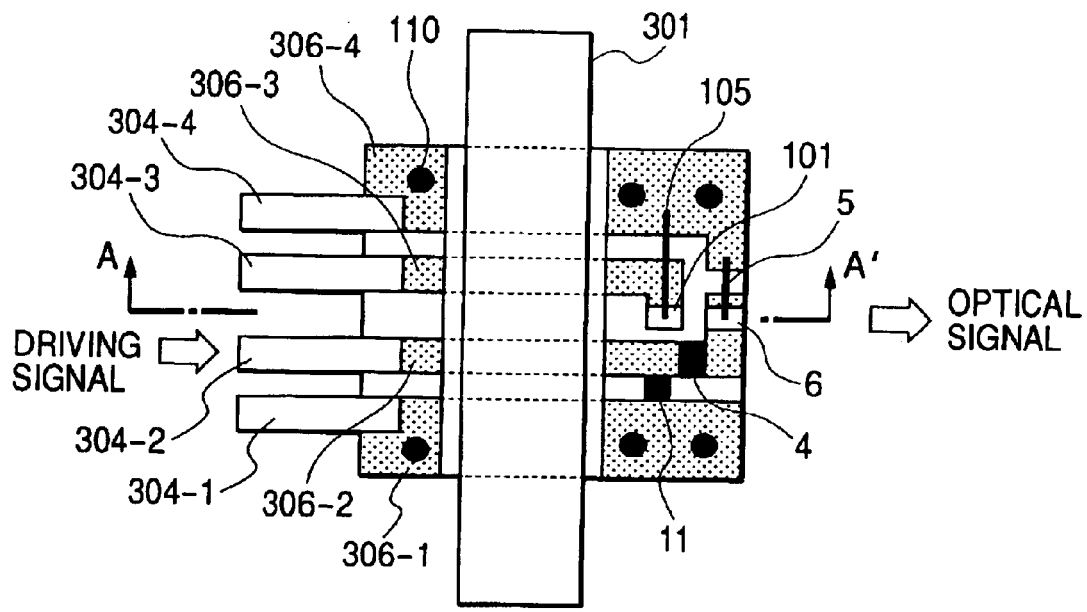
Figure 23B:
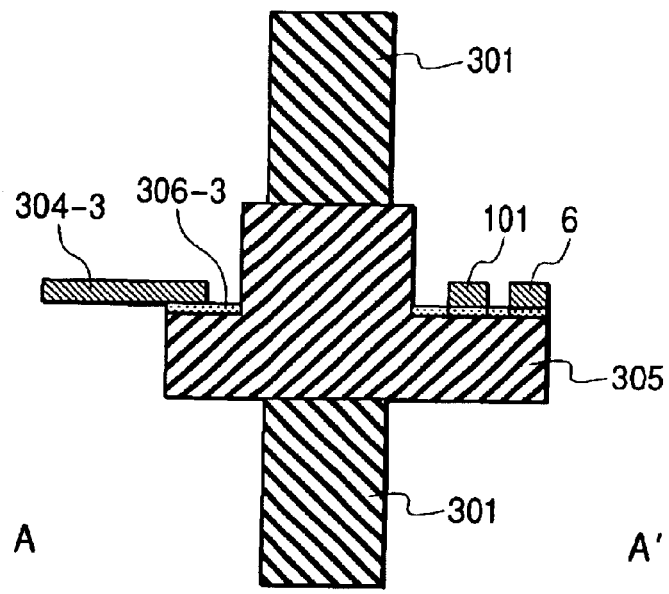

FIG. 10, comprising FIGS. 10A and 10B, is a view for explaining a first embodiment according to the invention;

FIGS. 11A, 11B, 11C, and 11D are views showing electrode patterns disposed on three ceramic layers constituting a package main body of an LD module according to a first embodiment of the invention;

FIGS. 12A, 12B, 12C, and 12D are cross sectional views of a device showing an example of a method for manufacturing an LD module according to the invention;

FIGS. 13A and 13B are graphs showing high frequency reflection characteristics of the LD module while comparing cases where the damping resistor is present and absent;

FIG. 14 is a constitutional view of an optical transceiver using an LD module according to the invention;

FIG. 15 is a view showing a constitution of a fiber transmission system using an optical transceiver according to the invention;

FIGS. 16A and 16B are views for explaining a second embodiment according to the invention;

FIGS. 17A and 17B are views for explaining a third embodiment according to the invention;

FIGS. 18A and 18B are views for explaining a fourth embodiment according to the invention;

FIG. 19 is a block diagram showing a state of mounting an existent LD module on a printed circuit boad;

FIG. 20 is a block diagram showing a method of decreasing degradation of an optical wave in the prior art;

FIG. 21 is a view for explaining the cause for the degradation of an optical waveform generated upon modulation at 10 Gbit/s in an existent LD module;

FIGS. 22A, 22B, 22C, and 22D are views for explaining a fifth embodiment according to the invention; and FIGS. 23A and 23B are views for explaining the inside of a module according to the fifth embodiment of the present invention, with a cap having a lens being removed.

DESCRIPTION OF THE PREFERRED EMBODIMENT

At first, as a premise of the present invention, it is to be discussed why ringing cannot be improved effectively for a high-speed driving signal at 10 Gbit/s using the existent parallel damping resistor with reference to the equivalent circuit shown in FIG. 21. As will be described later, the constitution of FIG. 21 is different from that of FIG. 20 in that the parallel damping resistor 10 and the wire bond 5 are spaced by $\lambda/10$ or more, because the bit-rate of electrical signal increases up to 10 Gbit/s. Other identical members carry the same reference numerals. Incidentally, $\lambda$ means herein a value corresponding to the length of the 1 bit of the high frequency signal on the high-frequency transmission line.

One bit of the 10 Gbit/s signals is 100 ps. This corresponds to about 12 mm on an aluminum high-frequency transmission line 3 (dielectric constant: about 10) disposed in the module. On the other hand, the length (L) of the line 3 disposed in the module is typically 2 to 5 mm, which is longer compared with $\lambda/10$. Therefore, the reflection signal generated in the wire bond 5 is reflected again by the pin 2 and returns to the LD device 6 to cause ringing in the optical waveform. Even when the parallel damping resistance 10 is inserted to the outside of the module as a countermeasure, since the parallel damping resistance is not inserted between the two points of reflection, the waveform improving effect is decreased. Further, since the parallel damping resistor 10 and the wire bond 5 are spaced by $\lambda/10$ or more, phase of the electric signal is different between both of them. This results in a problem that the damping resistance does not operate effectively, particularly, against reflection at the wire bond. While the stray inductance of the pin 2 can be decreased remarkably by increasing the diameter of the pin (lead) as large as possible, it is difficult to decrease the stray inductance of the wire bond. Accordingly, even when the parallel damping resistor 10 is disposed, ringing due to the reflection between the wire bond and the driver IC 8 cannot be decreased effectively.

Based on the discussion noted above, various examples of equivalent circuits of the newly found LD module are shown in FIGS. 1 to 4. The function of the invention is to be described with reference to them. Since the reference numerals in each of the drawings are identical with those in the drawings referred to previously except the characteristic portion of the invention, detailed description will be omitted.

In all embodiments shown in FIG. 1 to FIG. 4 of the invention, it is a first feature that a damping resistor 11 connected in parallel with the LD device is provided in the inside of the LD module main body, that is, in the inside of the package. The parallel damping resistor is inserted at the position between the high-frequency transmission line 3 and the terminating resistor 4 in FIG. 1, between the pin 2 and the high-frequency transmission line 3 in FIG. 2, on the midway of the high-frequency transmission line 3 in FIG. 3, and between the terminating resistor 4 and the wire bond 5 in FIG. 4. In any of FIGS. 1 to 4, the parallel damping resistor 11 is inserted between the pin 2 and the wire bond 5 causing signal reflection. Accordingly, ringing generated from both of them as the reflection points can be attenuated effectively during high-speed modulation at 10 Gbit/s or more. Reference numeral 10 in each of the drawings showing various embodiments of the invention is the so-called external damping resistor disposed outside the package. According to the invention, good characteristics can be obtained without using the external damping resistor 10. In this sense, the external damping resistor 10 is depicted with a parenthesis in each of the figures. However, the external damping resistor 10 may be used also in accordance with the requirement of the characteristics.

As described previously, the reflection is predominantly larger at the wire bond 5 compared with the reflection at the pin 2. Accordingly, as the parallel damping resistor 11 is disposed nearer to the wire bond 5 as much as possible, damping resistor acts more effectively since the phase of the electric signal of the pin 2 coincides with that of the wire bond 5. Specifically, to allow the phases to substantially coincide with each other, the damping resistor 11 is disposed at a distance from the wire bond, by $\lambda/10$ or less if possible and, by $\lambda/5$ or less at worst. That is, reflection can be decreased more effectively when the damping resistor 11 is disposed at a position from the wire bond, by 1.2 mm or less if possible and, by 2.4 mm or less at worst for the signals at 10 Gbit/s. Since the wire bond and the laser-diode are situated closely, it may be also said that the damping resistor 11 is disposed at a position from the laser-diode, by 1.2 mm or less if possible and, by 2.4 mm or less at worst.

Figure 1:
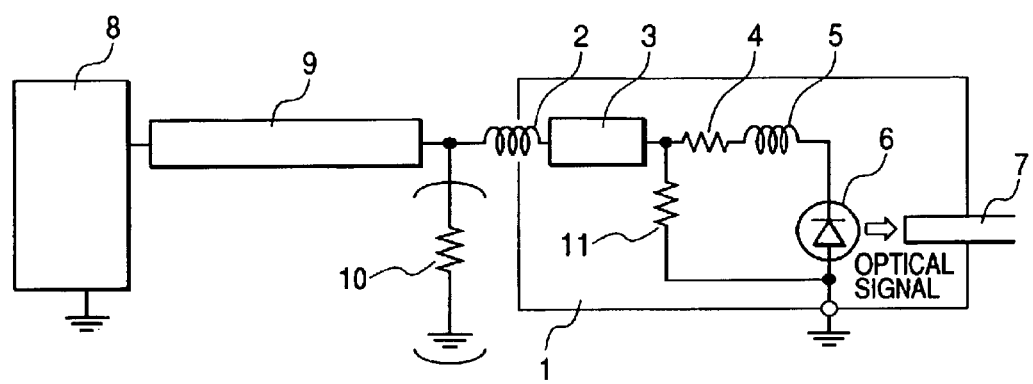
FIG. 1 is an equivalent circuit diagram for explaining a first constitution of an LD module according to the invention.
Figure 2:
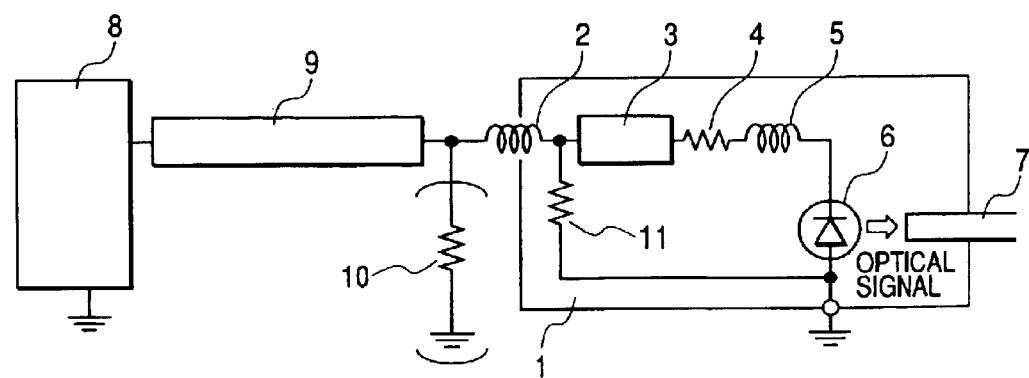
FIG. 2 is an equivalent circuit diagram for explaining a second constitution of an LD module according to the invention.

With the view point described above, more preferred waveform can be expected in the order of FIG. 4, FIG. 1, FIG. 3 and FIG. 2. However, in a case of using the constitution shown in FIG. 4 in which reflection can be decreased most effectively, it involves a difficulty that if the serial resistance value of the LD varies, the ratio of currents flowing to the damping resistor 11 and the LD 6 changes greatly to remarkably vary the driving current for obtaining predetermined optical waveform or optical intensity. On the contrary, in the constitution shown in FIG. 1, even when the resistance value of the LD should vary, the ratio of the currents flowing through the damping resistor and the LD device does not vary so much as in FIG. 4 since the terminating resistor 4 is inserted in series. That is, variations of the driving current of the module can be suppressed smaller compared with the case of FIG. 4. In view of the foregoing discussion, among the various specific embodiments of the invention, FIG. 1 shows a particularly excellent constitution. When the constitution shown in FIG. 1 is adopted and, further, it is adapted to sufficiently decrease the stray inductance for the portion of pin 2 is adopted, a good optical waveform can be obtained without using the external damping resistor 10.

Then, the resistance value (Rd) of the damping resistor 11 disposed in the LD module is to be discussed. In the respective LD modules shown in FIG. 1 to FIG. 3, the driving current (Imod) for LD module can be expressed with reference to the current (Ichip) flowing the LD device, the value (Rd) for the damping resistor, the terminating resistor ($R_0$), and resistance value (r) of the LD device and the threshold voltage (Vth) of the LD device as:

$$Imod = Ichip \cdot (Rd + R_0 + r)/Rd + Vth/Rd \quad \text{(Equation 1)}$$

The equation is an approximate equation neglecting the stray inductance of the wire bond in the strict meaning. However, in the practice of the invention, it may suffice to be based on the approximate equation. Accordingly, the current amplitude necessary for modulation is increased by the factor of $(Rd+R_0+r)/Rd$ compared with a case of not using the damping resistor. $R_0+r$ are set so as to be generally matched with the nominal impedance ($Z_0$) used for the design of the module.

In a case of the LD module, $Z_0$ is often set to 20 to 30 $\Omega$ with a view point of easy constitution of the driving circuit. In order to suppress increase of the current amplitude necessary for driving to 30% or less, it is necessary that Rd is 67 $\Omega$ or more. On the other hand, when the current flowing through the damping resistor is excessively small compared with the current flowing to the wire bond (LD), the reflection reducing effect is decreased. Accordingly, it is necessary that Rd is less than ten times of $R_0+r$. Accordingly, it is necessary that Rd is set to 300 $\Omega$ or less. From the foregoing result, in the respective LD modules shown in FIG. 1, FIG. 2 or FIG. 3, Rd is preferably set between 67 $\Omega$ and 300 $\Omega$.

While it has been previously described that $R_0+r$ are substantially matched with $Z_0$, since the impedance of the module is lowered by using the parallel damping resistor, impedance matching is improved and the highfrequency reflection can be reduced when the value of the terminating resistor ($R_0$) is made larger than usual while taking the foregoings into consideration. Specifically, better reflection characteristics can be obtained by setting the parallel resistance of R+r and Rd such that they are generally matched with a nominal impedance, that is, they can generally satisfy the relation:

$$0.8 < Z_0(1/(R_0+r)+1/Rd) < 1.2 \quad \text{(Equation 2)}$$

That is, it is suitable that the relation of: $1/Z_0 = 1/(R_0+r)+1/Rd$ is aligned at an accuracy of about 20%. Thus, it is possible to reduce the high frequency wavelength reflection characteristics (S11) to −20 dB or less in the low frequency wave region.

Figure 5:
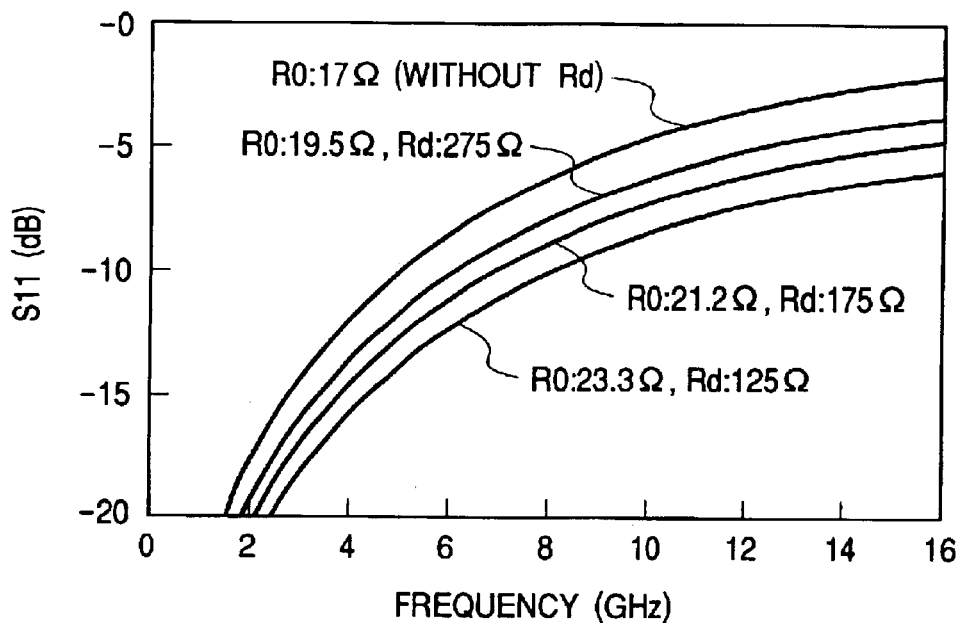
FIG. 5 is a graph showing the calculation of high frequency reflection characteristics of an LD module according to the invention.

FIG. 5 shows the calculation of the high frequency wave reflection characteristic (S11) of an example in which Rd and $R_0$ can satisfy Equation 2 when the stray inductance of the wire bond is 0.6 nH and r=8 $\Omega$ in the LD module shown in FIG. 1. The abscissa denotes the frequency and the ordinate denotes the high frequency reflection (S11). In this case, for the sake of simplicity, the inductance of the pin 2 is neglected being assumed as 0. The high frequency reflection (S11) is a value indicating how many reflection signals return when signal are inputted. A graph with no Rd, that is, no damping resistance in FIG. 5 shows a comparative example. It can be seen that the high frequency reflection characteristics (S11) can be enhanced by using the parallel damping resistance (Rd).

For high-speed modulation of the LD device at 10 Gbit/s, it is necessary to provide the LD device with a DC bias current (Ib, chip) at about 1 to 2 times the threshold current. The bias current of the module (Ib, mod) necessary in the case of using the parallel damping resistor is represented based on the equation (1) as:

$$Ib, mod = Ib, chip \cdot (Rd+R_0+r)/Rd + Vth/Rd \quad \text{(Equation 3)}$$

and the DC bias current is also increased by using the damping resistor.

Figure 6:
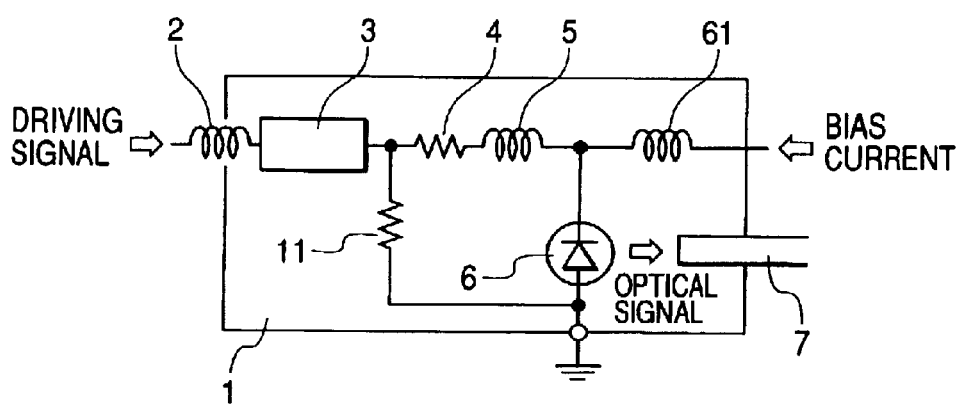
FIG. 6 is an equivalent circuit diagram for explaining a fifth constitution of an LD module according to the invention.

On the contrary, if a system is adopted, as shown in FIG. 6, in which the pin to be loaded with a DC bias current is disposed and the bias current is supplied separately from the modulation signal, the bias current can be lowered. In the figure, this is indicated as a bias current at the portion together with an arrow. The bias current in this case can be expressed as:

$$Ib,\text{mod}=Ib,\text{chip}\cdot(Rd+R_0+r)/Rd+R_0)+V\text{th}/(Rd+R_0) \quad \text{(Equation 4)}$$

As described above, the bias current can be decreased in this embodiment compared with the case of Equation 3. In this case, it is necessary to dispose an AC block circuit 61 in the LD module for blocking the high frequency modulation signals so that the high frequency signals do not leak to the bias current circuit. An inductor, ferrite bead or the like can be used as the AC block circuit 61.

Figure 7:
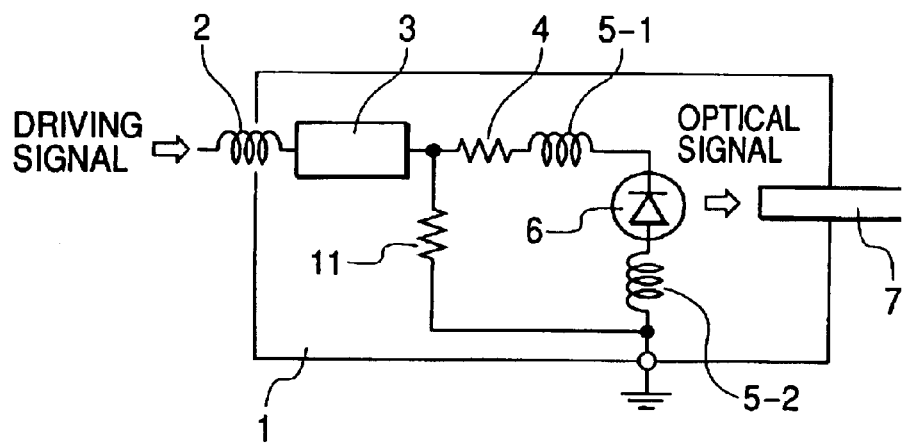
FIG. 7 is an equivalent circuit diagram for explaining a sixth constitution of an LD module according to the invention.
Figure 8:
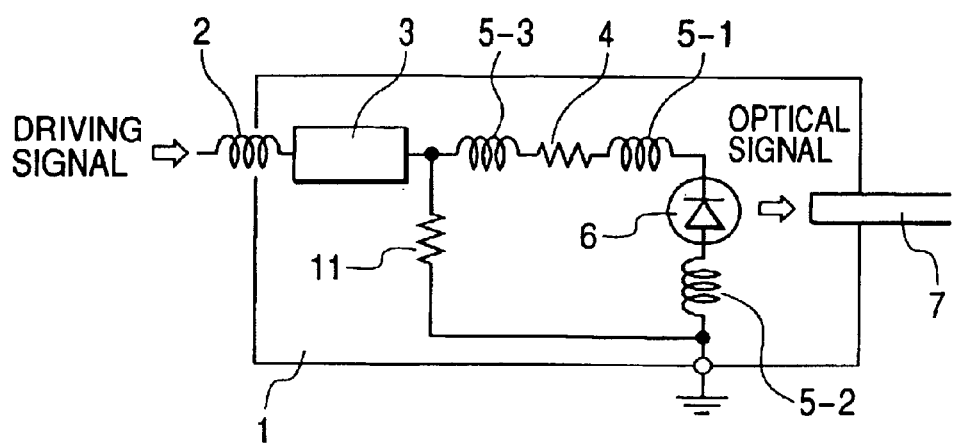
FIG. 8 is an equivalent circuit diagram for explaining an seventh constitution of an LD module according to the invention.

Other embodiments of the invention are shown in FIGS. 7 and 8, respectively. FIG. 7 is an embodiment of using wire bonds 5-1 and 5-2 on the signal side and the ground side, respectively, upon LD connection. Since the wire bonds 5-1 (stray inductance L1) and 5-2 (stray inductance L2) are in a serial relation, FIG. 7 is quite equivalent in view of the circuit with the case in FIG. 1 where the stray inductance of the wire bond 5 in FIG. 1 are L1+L2. Accordingly, the damping resistor 11 can effectively decrease also the reflection caused by the wire bond 5-2 on the side of the ground. Further, FIG. 8 shows a case where the wire bond 5-3 is used also before the terminating resistor. Likewise, the damping resistor 11 can effectively decrease also the reflection caused at the wire bond 5-3. Further, it will be apparent in FIGS. 1 to 4 and FIGS. 7 and 8 that the damping resistor 11 contributes effectively to the reduction of the reflection caused by the wire bond even how the order of connection for the wire bond 5, the terminating resistor 4 and the LD device 7 connected in series are replaced with each other. Further, the effect of the invention can be attained also by inserting a capacitor to block a DC current in series with the parallel damping resistor to suppress the current consumption in the parallel damping resistor.

Embodiments of the present invention are to be described successively with reference to their respective concrete structures.

<Embodiment 1>

Figure 9:
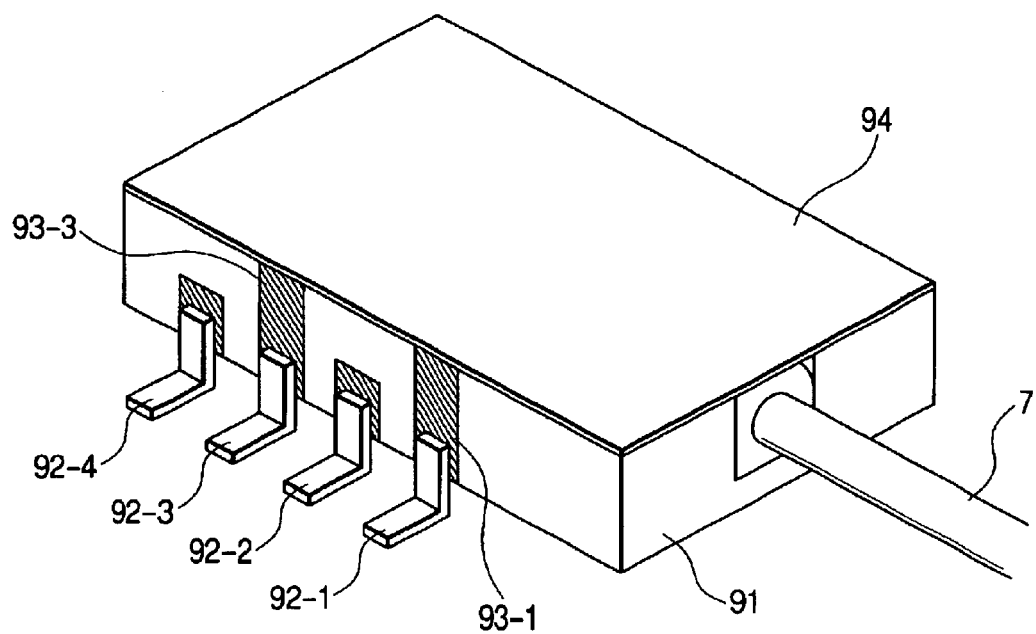
FIG. 9 is a perspective view of an LD module according to the invention.
Figure 11A:
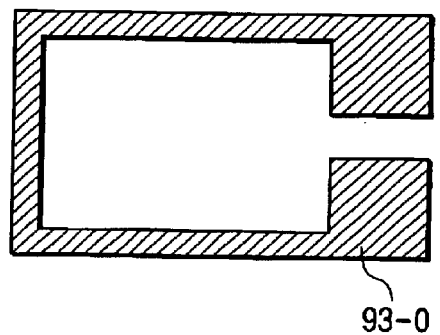
Figure 11B:
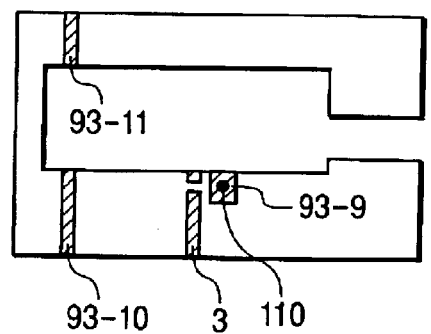
Figure 11C:
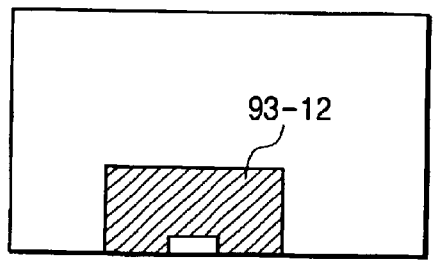
Figure 11D:
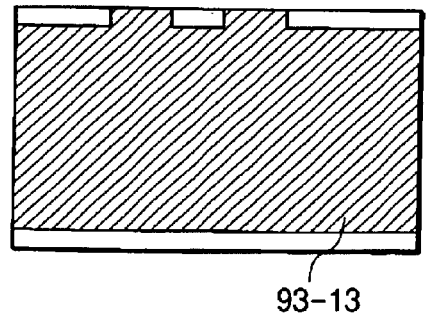

FIG. 9 shows a perspective view of an LD module according to a first embodiment of the present invention. This module is a mini-DIL (dual-in-line) type LD module having eight pins. FIG. 10A is a plan view before mounting a cap 94 of the LD module and FIG. 10B is a cross sectional view taken along line A—A' in FIG. 10A. FIG. 11 shows electrode patterns of three-layered ceramic layers constituting a main body 91 of the module. FIG. 11A shows an electrode pattern on the upper surface of a first layer 107 (that is, upper surface of a package main body), FIG. 11B shows an electrode pattern on the upper surface of a second layer 108, FIG. 11C shows an electrode pattern on the upper surface of a third layer 109, and FIG. 11D shows an electrode pattern on the rear face of a third layer 109 (that is, lower surface of the main body).

The LD module has an LD device 6 and a monitor PD (photo-diode) device 101 for monitoring the optical output. Pins 92-1 and 92-3 are pins for connection with the ground. Ground electrode patterns 93-0, 93-12, and 93-13 are connected with the pins described above by way of electrode patterns 93-1 and 93-3 on the lateral side of the package. Reference numeral 92-2 denotes a lead pin for supplying driving signals, and the driving signals are supplied through the lateral side electrode pattern 93-2, a micro-strip line 3, a terminating resistor 4 (resistance value $R_0$) disposed on the line, and a wire bond 5-1 to the LD device 6 (device resistance value r) and then led to the ground by way of an electrode 111-1 on a sub-mount 102 made of silicon, a wire bond 5-2, an electrode pattern 93-9 and a through-hole 110.

A damping resistor 11 (resistance value Rd) is disposed between the micro-strip line 3 and the electrode pattern 93-9. The characteristic impedance of the micro-strip line 3 is set to 25 Ω in this embodiment by setting the width thereof and the substrate thickness of the second layer. Their respective resistance values are: r=8 Ω, R0=23.3 Ω, Rd=125 Ω.

The photo-current generated by the monitor PD device 101 is outputted through wire bonds 105-1 and 105-2, electrode patterns 93-10 and 93-11 and lateral side electrode patterns 93-4 and 93-5 to a portion between pins 92-4 and 92-5. Further, the metal cap 94 is secured with electric conduction to the electrode pattern 93-0 disposed on the upper surface of the package. The package has a size of 7.4×18.5×3 mm and the length of the strip-line is about 2.7 mm.

Figure 3:
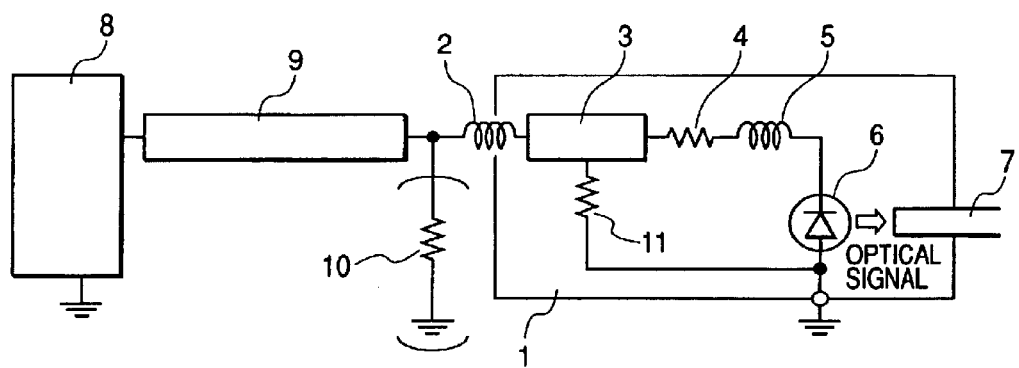
FIG. 3 is an equivalent circuit diagram for explaining a third constitution of an LD module according to the invention.
Figure 4:
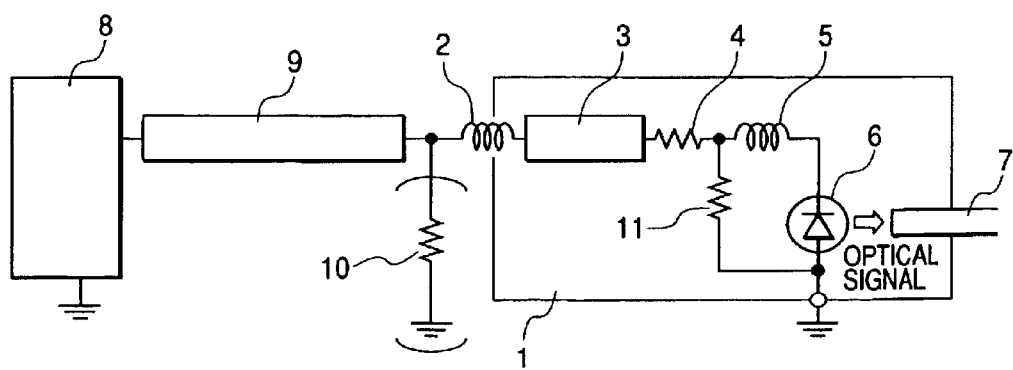
FIG. 4 is an equivalent circuit diagram for explaining a fourth constitution of an LD module according to the invention.

A production process of the LD module is to be described briefly with reference to FIG. 12. A main body 91 has a multi-layered structure comprising three layers of alumina ceramic plates 107, 108 and 109. This stack of layers is manufactured by using a green-sheet process (printing and laminating process) or a sheet-laminating process. That is, a rare ceramic sheet (green sheet) is formed by extending slurry formed by adding an organic binding and a sintering aid to an aluminum powder, which is then punched out by a die into a predetermined shape and at the same time, a via hole 110 is bored. Then, a conductive paste such as formed of W or Mo is screen printed and the strip-line 3, and the electrode patterns 93-0, 93-9 to 93-13 shown in FIG. 3 are formed in each of the layers. Three-layers of the green sheets are stacked and sintered (FIG. 12A). Subsequently, this stack of layers is cut into individual package size by dicing.

A conductor paste is coated on the lateral side of the thus prepared stack of layers to form electrode patterns 93-1 to 93-8, to which leads 92-1 to 92-8 are fixed by Ag brazing. Finally, finishing Ni/Al electrolytic plating is applied to the exposed electrode patterns.

Figure 12A:
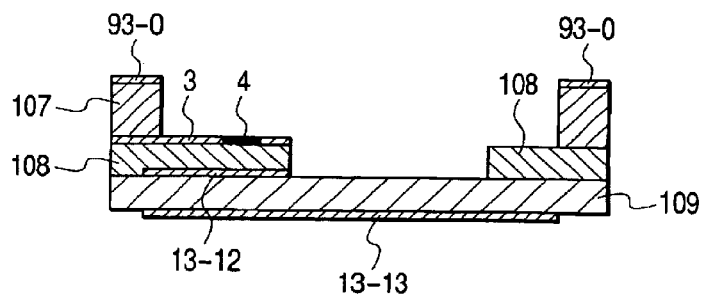
Figure 12B:
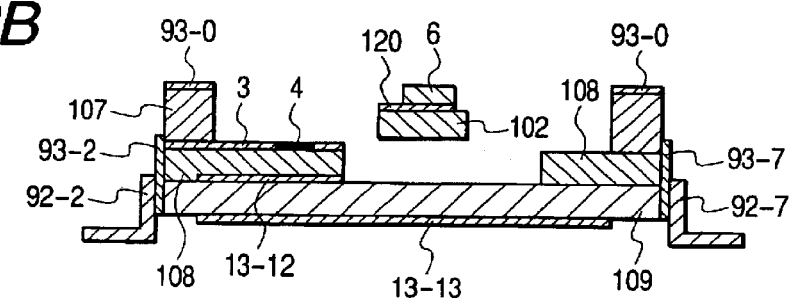

On the other hand, an LD device 6 and a PD device 101 are fixed by using AuSn solder 120 on a sub-mount 102 made of silicon in which a V-groove for accurately positioning a fiber and electrodes 11-1 and 11-2 for mounting the device. The silicon sub-mount 102 is fixed by a die bond paste to the ceramic package main body mounting, thereon, the terminating resistor 4, and the parallel damping resistor 11 (FIG. 12B).

Figure 12C:
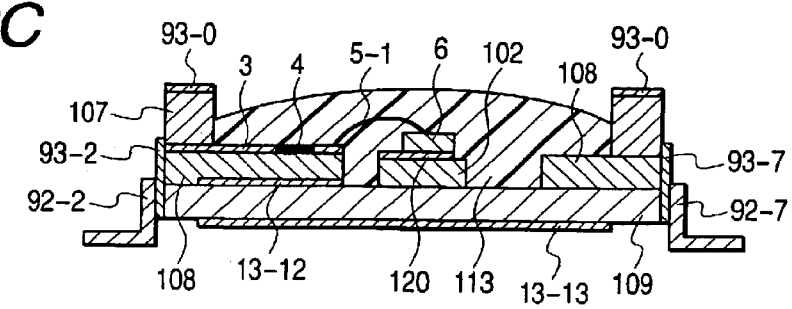

Wire bonds 5-1, 5-2, 105-1, and 105-2 are applied using gold wires to connect the LD device and the PD device with the electrode patterns of the module (FIG. 12C).

Figure 12D:
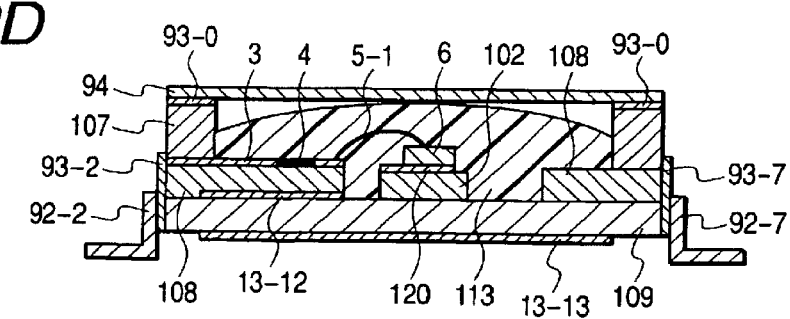

A covering at the end of an optical fiber 7 having a protective cover (jacket) such as made of nylon is removed to expose the internal core wire 112, which is secured by means of an adhesive to the V-groove formed in the silicon sub-mount 102. Further, the fiber 7 is fixed by an adhesive 106 to the main body 91. A transparent gel-like silicon resin 113 is injected into the inside of the main body and baked to attain resin encapsulation. A metal cap 94 is fixed on the metal pattern 93-0 disposed on the upper surface of the module by using a conductive adhesive (FIG. 12D).

The thus manufactured module is mounted on the printed circuit board having a strip-line of 25 Ω and the high frequency reflection characteristics (S11) were measured. In this embodiment, an external parallel damping resistor 10 to the module was not used. FIG. 13A shows the measurement of an existent LD module with no damping resistance 11 and FIG. 13B shows a measurement of an LD module according to the invention using the damping resistor 11. In each of the graphs, the abscissa denotes frequency and the ordinate denotes high frequency wave reflection (S11). When both of the characteristics are compared, it can be easily recognized that S11 can be decreased greatly in accordance with the invention, that is, the reflection of driving signals in the LD module can be decreased remarkably in accordance with the invention.

FIG. 14 shows an example for the constitution of an optical transceiver using the LD module according to the invention. Electrical signals at 600 Mbit/s for 16-ch inputted to an optical transceiver 200 are multiplexed by an IC 201 having an MUX (multiplexing) function and converted into 10 Gbit/s electric signals. The signals are amplified and waveform-shaped by an LD driver IC 202 and supplied to an LD module 203, converted into optical signals, and outputted from a fiber end 208. In this case, the LD module 203 is an LD module obtained by the first embodiment of the invention. An optical connector 204-1 for connecting the fiber is disposed at the top end of the fiber of the LD module.

Optical signals at 10 Gbit/s entering from the other optical connector 204-2 enters by way of the fiber end 209 to a PD module 205 having a PD device and a pre-amplifier IC. The optical signals are converted by the PD module 205 into electric signals at 10 Gbit/s. Then, an IC 206 having a clock extraction function and identifying function converts the electric signals into waveform shaped signals while suppressing jitter. Further, they are converted by an IC 207 having a DEMUX (demultiplexing) function into electric signals at 600 Mbit/s 16-ch and then outputted. Thus, a good optical waveform could be obtained from the connector 204-1.

Further, an optical transmission system is constituted by using two sets of the optical transceiver. FIG. 15 shows an example of the optical transmission system. The optical transmission system comprises a transmission device A (220) and a transmission device B (221) each of which has optical transceivers 211-1 and 211-2. The transceivers of the transmission devices A and B are connected by two optical fibers 21-1 and 212-2 and can exchange signals at 10 Gbit/s therebetween. The communication system was operated normally free from errors <Embodiment 2>

FIG. 16 shows an LD module according to a second embodiment of the invention. FIG. 16A is a plan view before mounting a cap 94 of an LD module, and FIG. 16B is a cross sectional view taken along line A—A' in FIG. 16A. A perspective view for the LD module in a state of mounting the cap is identical with that shown in FIG. 9 for Embodiment 1. This embodiment is identical with Embodiment 1, except that the damping resistor 11 is connected on the midway of the strip-channel 3. Accordingly, detailed explanations therefore will be omitted. Also with the structure described above, good characteristics can be obtained in the same manner as in Embodiment 1.

<Embodiment 3>

FIG. 17 shows an LD module according to a third embodiment of the invention. FIG. 17A is a plan view before mounting a cap 94 of an LD module, FIG. 17B is a cross sectional view taken along line A—A' in FIG. 17A. The perspective view of the LD module in a state of mounting the cap is identical with that shown in FIG. 9 for Embodiment 1. This embodiment is identical with Embodiment 1, except that the damping resistor 11 is connected at a portion nearer to the signal input pin of the strip-line 3. Accordingly, detailed descriptions will be omitted. Also with the structure described above, the invention can be practiced with good characteristics in the same manner as in Embodiment 1.

<Embodiment 4>

FIG. 18 shows an LD module according to a fourth embodiment of the invention. FIG. 18A is a plan view before mounting a cap 94 of an LD module, and FIG. 18B is a cross sectional view taken along line A—A' in FIG. 18A. The perspective view of the LD module in a state of mounting the cap is identical with that shown in FIG. 9 for Embodiment 1.

In this embodiment, a terminating resistor 4 is disposed on a silicon sub-mount 102. Driving signals are transmitted by way of a strip-line 3, a wire bond 5-1, a terminating resistor 4, and a wire bond 5-3 to an LD device. Further, in this module, a DC bias current can be provided from the pin 92-6 separately from driving signals. The bias current is supplied by way of a pin 92-6, a lateral side electrode pattern 93-6, an electrode pattern 93-14, a coil-type inductor 141 (160 nH), an electrode pattern 93-13, and a wire bond 111-3 to the LD device 6. The inductor 141 blocks the modulation signal from leaking to the DC bias pin. Also in this module, a good optical waveform at 10 Gbit/s with less ringing caused by reflection of electric signals could be obtained in the same manner as in Embodiment 1.

<Embodiment 5>

FIGS. 22A, 22B, 22C, and 22D show an LD module according to a fifth embodiment of the invention based on triangulation. This module is a coaxial type module in the form of a sealed package prepared by seam welding a cap 303 having a lens 302 to a cylindrical main body 301. In the same manner as in usual CAN type modules, an LD module with a pig-tail or connector is obtained by adjustably fixing an optical fiber or a receptacle to the package.

FIG. 23A is a plan view showing the state of the coaxial module with the cap being removed and FIG. 23B is a cross sectional view taken along line A—A' in FIG. 23A. A substrate 305 comprising a multi-layered laminate structure made of AlN ceramics penetrates a main body 301 of the module and they are bonded together by brazing. Electrode patterns 306-1 to 306-4, a terminating resistor 4, a parallel damping resistor 11 and a plurality of via holes 110 for connecting the ground pattern and the rear face of a multi-layered substrate are formed in the multi-layered substrate 305, and four pins 304-1 to 304-4 are brazed to the electrode patterns. Further, an LD device 6 and a monitor PD device 101 are die-bonded on the electrode patterns and the devices and the electrode patterns are connected by wire bonds 5 and 105. The pins 304-1 and 304-4 of the module are ground pins, a pin 304-2 is for inputting a high frequency driving signals, and a pin 304-3 takes out the output of the monitor PD.

The high frequency driving signals inputted from the pin 304-2 to the module enter by way of the high-frequency transmission line 306-2 to the inside of the module and then led through the terminating resistor 4, the LD device 6 and the wire bond 5 to the ground. A parallel damping resistor 11 is disposed between the high-frequency transmission line in the inside of the module and the ground in the same manner as in Embodiments 1–4. The values of the impedance of the high-frequency transmission line, the terminating resistor and the parallel damping resistor can be set in the same manner as in Embodiments 1 to 4. This can prevent degradation (ringing) of the optical signals caused by the reflection of the electric signals and a good optical waveform can be obtained also for the high-speed modulation at the level of 10 Gbit/s. The optical signals outputted from the LD device 6 are collected by a lens 302 and optically coupled with an optical fiber or an optical connector (not illustrated) at high efficiency. Further, the photo-current from the monitor PD 101 is outputted by way of the electrode pattern 306-3 and a pin 304-3 and the optical output can be monitored by measuring the current.

In the five embodiments described above, descriptions have been made, particularly, of mini-DIL type and coaxial type LD modules, but it will be apparent that the invention can be practiced in the same manner in other types of LD modules such as a butterfly type.

The present invention can provide a laser-diode module capable of generating a good optical waveform even upon modulation generally at 10 Gbit/s or higher.

A description of reference numerals will be made as follows:

1 . . . main body of LD module, 2 . . . pin for inputing driving signal, 3 . . . high-frequency transmission line, 4 . . . terminating resistor, 5 . . . wire bond, 6 . . . LD device, 7 . . . optical fiber, 8 . . . driver IC, 9 . . . high-frequency transmission line, 10 . . . damping resistor, 11 . . . damping resistor, 91 . . . main body, 92 . . . pin, 93 . . . electrode pattern, 101 . . . PD device, 102 . . . sub-mount, 105 . . . wire bond, 110 . . . via hole, 111 . . . electrode, 112 . . . fiber core, 113 . . . transparent resin, 201 . . . MUX-IC, 202 . . . LD driver IC, 203 . . . LD module of the invention, 204 . . . optical connector, 205 . . . PD module, 206 . . . clock and data recovery circuit IC, 207 . . . DEMUX-IC, 211 . . . optical transceiver of the invention, 212 . . . optical fiber, 301 . . . main body, 302 . . . lens, 303 . . . cap, 304 . . . pin, 305 . . . multi-layered ceramic structure, 306 . . . electrode pattern.

What is claimed is:

1. A laser-diode module wherein at least a terminal for inputting an electric signal is provided at a package of the laser-diode module, a high-frequency transmission line, a first resistor and a laser-diode device are successively connected in series from the terminal for inputting an electric signal within the package, and within the package a first end of a second resistor is connected at one point on an electric circuit extending from the terminal for inputting an electric signal to one end of the laser-diode device, and a second end of the second resistor is connected an with other end of the laser-diode device which is not connected with the first resistor.

2. A laser-diode module as defined in claim 1, wherein one end of the high-frequency transmission line is connected with the terminal for inputting an electric signal, an other end of the high-frequency transmission line is connected by way of the first resistor to a first electrode of the laser-diode device, the one end of the second resistor is connected with both an end, of the high-frequency transmission line, connected to the first resistor and an end, of the first resistor, connected with the high-frequency transmission line, and the other end of the second resistor is connected with a second electrode of the laser-diode device.

3. A laser-diode module as defined in claim 1, wherein one end of the high-frequency transmission line is connected with the terminal for inputting an electric signal, the other end of the high-frequency transmission line is connected by way of the first resistor with the first electrode of the laser-diode device, the one end of the second resistor is connected with a connection point between the first terminal and the high-frequency transmission line, and the other end of the second resistor is connected with a second electrode of the laser-diode device.

4. A laser-diode module as defined in claim 1, wherein one end of the high-frequency transmission line is connected with the terminal for inputting an electric signal, the other end of the high-frequency transmission line is connected by way of the first resistor to the first electrode of the laser-diode device, the second resistor is disposed so as to connect the one end thereof to a desired position midway of the high-frequency transmission line and the second end thereof to a second electrode of the laser-diode device.

5. A laser-diode module as defined in claim 1, wherein one end of the high-frequency transmission line is connected with the terminal for inputting an electric signal, an other end of the high-frequency transmission line is connected by way of the first resistor with a first electrode of the laser-diode device, and the second resistor is disposed to connect the first electrode and a second electrode of the laser-diode device.

6. A laser-diode module as defined in claim 1, further comprising a terminal for inputting a DC bias current and a circuit portion having a function of blocking high frequencies in the inside of the package, wherein one end of the high-frequency transmission line is connected with the terminal for inputting an electric signal, the other end of the high-frequency transmission line is connected by way of the first resistor to a first electrode of the laser-diode device the one end of the second resistor is connected with both the other end of the high-frequency transmission line connected with the first resistor and an end of the first resistor connected with the high-frequency transmission line, the other end of the second resistor is connected with a second electrode of the laser-diode device, and the terminal for inputting a DC bias current and the first electrode of the laser-diode device are connected by way of the circuit portion having a function of blocking high-frequency signal.

7. A laser-diode module as defined in claim 1, wherein a distance between the second resistor and the laser-diode device is 2.4 mm or less.

8. A laser-diode module as defined in claim 2, wherein a distance between the second resistor and the laser-diode device is 2.4 mm or less.

9. A laser-diode module as defined in claim 5, wherein a distance between the second resistor and the laser-diode device is 2.4 mm or less.

10. A laser-diode module as defined in claim 1, wherein an optical signal generated from the laser-diode module is at about 10 Gbit/s or higher.

11. A laser-diode module as defined in claim 2, wherein an optical signal generated from the laser-diode module are at about 10 Gbit/s or higher.

12. A laser-diode module as defined in claim 5, wherein an optical signal generated from the laser-diode module are at about 10 Gbit/s or higher.

13. A laser-diode module as defined in claim 1, wherein an impedance of the high-frequency transmission line is from 20 to 30 $\Omega$, and a resistance value of the second resistor is from 67 to 300 $\Omega$.

14. A laser-diode module as defined in claim 2, wherein an impedance of the high-frequency transmission line is from 20 to 30 $\Omega$, and a resistance value of the second resistor is from 67 to 300 $\Omega$.

15. A laser-diode module as defined in claim 5, wherein an impedance of the high-frequency transmission line is from 20 to 30 $\Omega$, and a resistance value of the second resistor is from 67 to 300 $\Omega$.

16. A laser-diode module as defined in claim 1, wherein the following relation is established:

$$0.8 < Z_0(1/(R_0+r)+1/Rd) < 1.2$$

where $R_0$ represents a resistance value of the first resistor, Rd represents a resistance value of the second resistor, r represents a resistance value of the laser-diode device and $Z_0$ represents a nominal impedance of the laser-diode module.

17. A laser-diode module as defined in claim 2, wherein the following relation is established:

$$0.8 < Z_0(1/(R_0=r)+1/Rd) < 1.2$$

where R0 represents a resistance value of the first resistor, Rd represents a resistance value of the second resistor, γr represents a resistance value of the laser-diode device and $Z_0$ represents a nominal impedance of the laser-diode module.

18. A laser-diode module as defined in claim 5, wherein the following relation is established:

$$0.8 < Z_0(1/(R_0+r)+1/Rd) < 1.2$$

where R0 represents the resistance value of the first resistor, Rd represents a resistance value of the second resistor, r represents the resistance value of the laser-diode device and $Z_0$ represents a nominal impedance of the laser-diode module.

19. An optical transceiver comprising:
a plurality of terminals for inputting electric signals;
a multiplexing unit for converting a plurality of electric signals inputted from the plurality of terminals for inputting electric signals into one multiplexed signal;
an electro-optical conversion unit for converting the obtained multiplexed signal into optical signals; and
an optical fiber for emitting the electro-optically converted optical signals;
wherein the electro-optical conversion unit uses an optical module in which at least a terminal for inputting an electric signal is provided at a package of the optical module, a high-frequency transmission line, a first resistor and a laser-diode device are successively connected in series from the terminal for inputting an electric signal within the package, and within the package a first end of a second resistor is connected at least one point on an electric circuit extending from the terminal for inputting an electric signal to one end the laser-diode device, and a second end of the second resistor is connected with an other end of the laser-diode device which is not connected with the first resistor.

20. A fiber transmission system using, as an optical transmission source, an optical module wherein at least a terminal for inputting an electric signal is provided at a package of the optical module, a high-frequency transmission line, a first resistor and a laser-diode device are successively connected in series from the terminal for inputting an electric signal within the package, and within the package a first end of a second resistor is connected at one point on an electric circuit from the terminal for inputting an electric signal to one end of the laser-diode device and a second end of the second resistor is connected with an other end of the laser-diode device which is not connected with the first resistor.

* * * * *